(12) United States Patent
Morita et al.

(10) Patent No.: US 9,245,715 B2
(45) Date of Patent: Jan. 26, 2016

(54) DRAWING APPARATUS, AND METHOD OF MANUFACTURING ARTICLE

(71) Applicant: CANON KABUSHIKI KAISHA, Tokyo (JP)

(72) Inventors: Tomoyuki Morita, Utsunomiya (JP); Masato Muraki, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 14/054,314

(22) Filed: Oct. 15, 2013

(65) Prior Publication Data
US 2014/0106279 A1    Apr. 17, 2014

(30) Foreign Application Priority Data
Oct. 15, 2012    (JP) ................ 2012-228446

(51) Int. Cl.
| | | |
|---|---|---|
| H01J 37/147 | (2006.01) | |
| H01J 37/302 | (2006.01) | |
| H01J 37/317 | (2006.01) | |
| H01J 37/04 | (2006.01) | |
| B82Y 10/00 | (2011.01) | |
| B82Y 40/00 | (2011.01) | |

(52) U.S. Cl.
CPC ............ *H01J 37/3177* (2013.01); *B82Y 10/00* (2013.01); *B82Y 40/00* (2013.01); *H01J 37/045* (2013.01); *H01J 2237/0432* (2013.01); *H01J 2237/0435* (2013.01); *H01J 2237/31761* (2013.01)

(58) Field of Classification Search
CPC ... H01J 37/30; H01J 37/3002; H01J 37/3007; H01J 37/302; H01J 37/3023; H01J 37/3026; H01J 37/3177

USPC ......... 250/396 R, 398, 492.2, 492.21, 492.22
See application file for complete search history.

(56) References Cited

U.S. PATENT DOCUMENTS

| | | | | |
|---|---|---|---|---|
| 5,260,579 | A | * | 11/1993 | Yasuda et al. .............. 250/492.2 |
| 5,369,282 | A | * | 11/1994 | Arai et al. ................ 250/492.22 |
| 7,084,411 | B2 | * | 8/2006 | Lammer-Pachlinger et al. .......................... 250/492.1 |

(Continued)

FOREIGN PATENT DOCUMENTS

WO    2009/147202 A1    12/2009

OTHER PUBLICATIONS

M. J. Wieland, et al., "Throughput enhancement technique for MAPPER maskless lithorgraphy", Proc. of SPIE, vol. 7637, 76371Z, 2010. Abstract only.

*Primary Examiner* — Michael Logie
*Assistant Examiner* — David E Smith
(74) *Attorney, Agent, or Firm* — Rossi, Kimms & McDowell LLP

(57) ABSTRACT

The present invention provides a drawing apparatus for performing drawing on a substrate with a plurality of charged particle beams, comprising a blanker array including first and second groups, each of which includes at least one blanker, a deflector configured to deflect the plurality of charged particle beams to scan the plurality of charged particle beams on the substrate, and a controller configured to respectively supply first and second control signals to the first and second groups at first and second timings, wherein the first and second groups are respectively arranged at such relative positions that a positional difference between respective drawing regions thereof, due to a difference between the first and second timings, in a scanning direction of the deflector is compensated for.

13 Claims, 8 Drawing Sheets

(56) References Cited

U.S. PATENT DOCUMENTS

| | | | |
|---|---|---|---|
| 2005/0242302 A1* | 11/2005 | Platzgummer et al. | 250/492.22 |
| 2007/0125956 A1* | 6/2007 | Buschbeck et al. | 250/396 R |
| 2009/0212240 A1* | 8/2009 | Platzgummer et al. | 250/492.22 |
| 2012/0219914 A1* | 8/2012 | Muraki | 430/296 |

* cited by examiner

F I G. 6
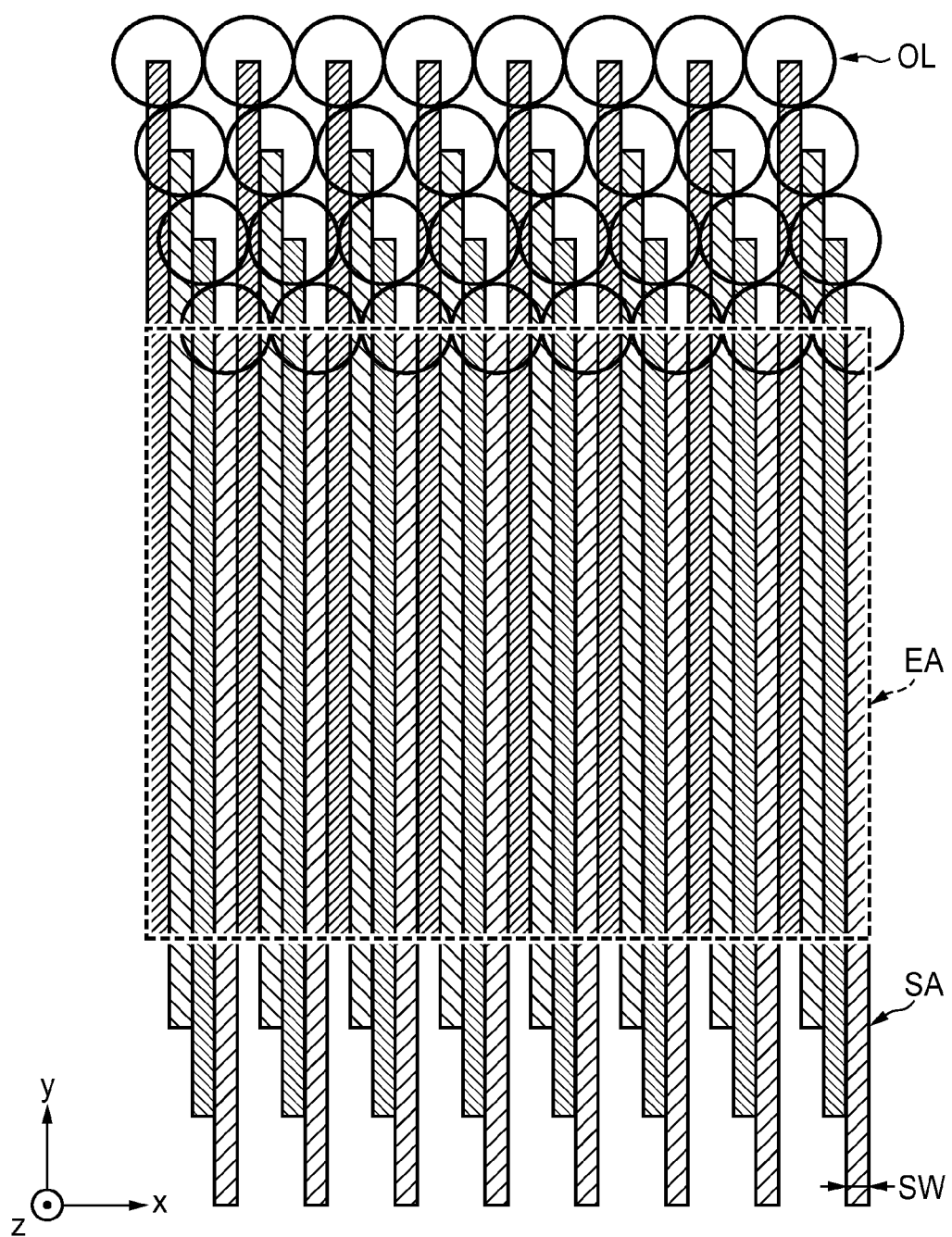

DRAWING APPARATUS, AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

Along with miniaturization and higher integration of circuit patterns in semiconductor integration circuits, a drawing apparatus which draws a pattern on a substrate using a plurality of charged particle beams (electron beams) has received a lot of attention. The drawing apparatus that uses the plurality of charged particle beams is described in, for example, WO 2009/147202. In recent years, the drawing apparatus is required to improve a throughput, and the number of charged particle beams is dramatically increased to meet such requirement.

In such drawing apparatus, for example, a plurality of blankers required to independently blank the plurality of charged particle beams are arranged, and signal lines required to supply control signals which controls the blankers are respectively connected to the blankers. For this reason, when the number of charged particle beams is increased, a large number of signal lines are used accordingly, and it is difficult to connect the large number of signal lines to the plurality of blankers. Hence, non-patent literature 1 has proposed a drawing apparatus which employs an active-matrix driving system for supplying control signals to respective blankers at different timings so as to increase a data volume to be transmitted per signal line and to reduce the number of signal lines.

In the drawing apparatus described in non-patent literature 1, the respective blankers control charged particle beams at different timings. On the other hand, a deflector required to scan the charged particle beams on a substrate simultaneously deflects a plurality of charged particle beams. For this reason, positions on the substrate, which are deviated in the scanning direction, may be unwantedly irradiated with the plurality of charged particle beams which are to strike on an identical position with respect to the scanning direction according to timing differences controlled by the blankers.

Non-Patent Literature 1: M. J. Wieland et. al., "Throughput enhancement technique for MAPPER maskless lithography", Proc. of SPIE, USA, SPIE, 2010, Vol. 7637, 76371Z

SUMMARY OF THE INVENTION

The present invention provides, for example, a drawing apparatus which is advantageous to compensation for a positional inconsistency between drawing regions caused by a control timing difference between blankers.

According to one aspect of the present invention, there is provided a drawing apparatus for performing drawing on a substrate with a plurality of charged particle beams, comprising: a blanker array including first and second groups, each of which includes at least one blanker; a deflector configured to deflect the plurality of charged particle beams to scan the plurality of charged particle beams on the substrate; and a controller configured to respectively supply first and second control signals to the first and second groups at first and second timings, wherein the first and second groups are respectively arranged at such relative positions that a positional difference between respective drawing regions thereof, due to a difference between the first and second timings, in a scanning direction of the deflector is compensated for.

Further aspects of the present invention will become apparent from the following description of exemplary embodiments with reference to the attached drawings.

BRIEF DESCRIPTION OF THE DRAWINGS

FIG. 6 is a view for explaining the positional relationship between a plurality of stripe regions;

DESCRIPTION OF THE EMBODIMENTS

Figure 1:
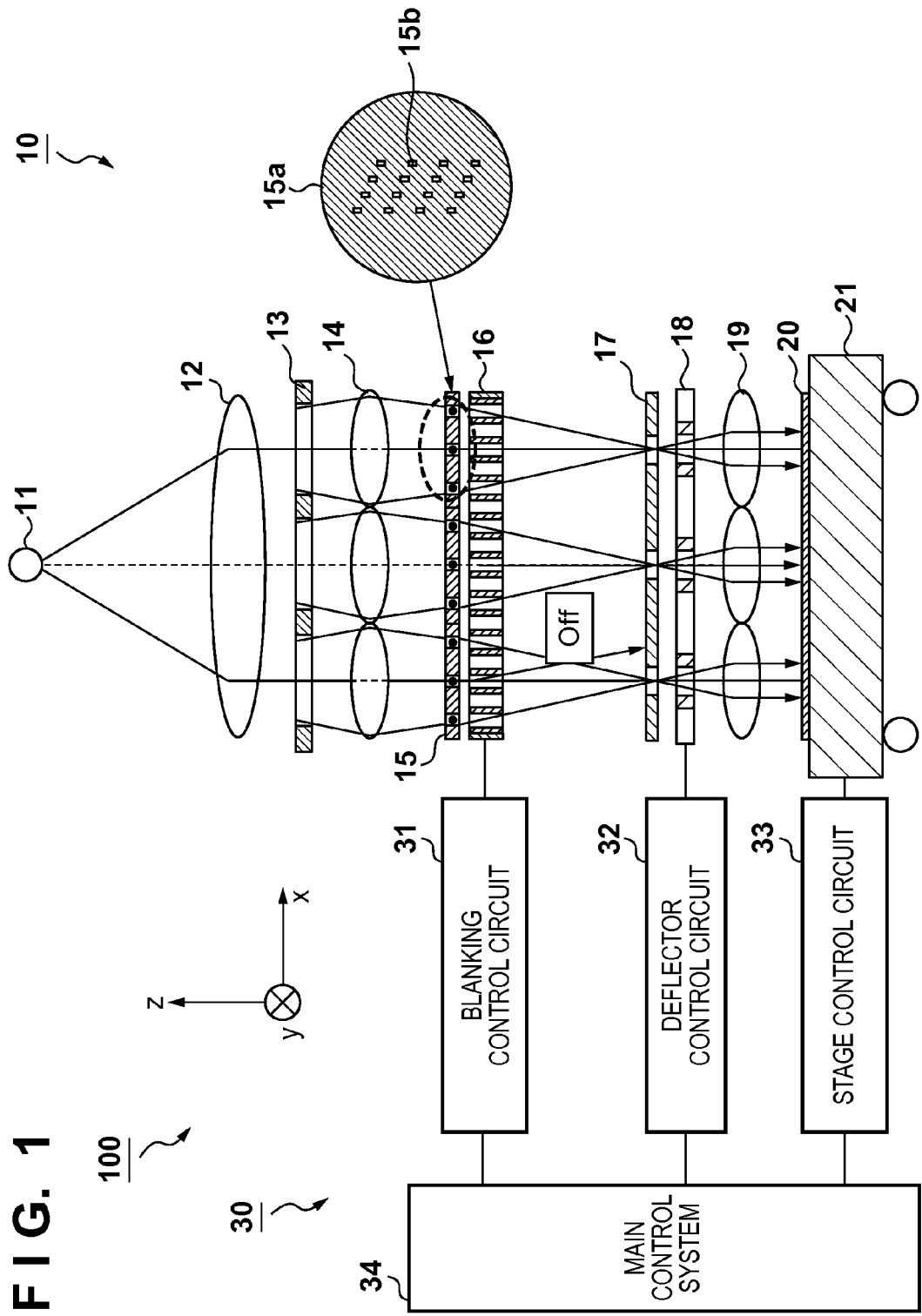
FIG. 1 is a schematic view showing a drawing apparatus according to the first embodiment.

Exemplary embodiments of the present invention will be described below with reference to the accompanying drawings. Note that the same reference numerals denote the same members throughout the drawings, and a repetitive description thereof will not be given. Also, assume that directions which are orthogonal to each other on a substrate surface will be defined as x and y directions, respectively, and a direction perpendicular to the substrate surface will be defined as a z direction in the respective drawings.

First Embodiment

A drawing apparatus 100 according to the first embodiment of the present invention will be described below with reference to FIG. 1. The drawing apparatus 100 of the first embodiment is configured by a drawing unit 10 which irradiates a substrate with charged particle beams to draw a pattern, and a control unit 30 (controller) which controls respective units of the drawing unit 10. The drawing unit 10 includes, for example, a charged particle source 11, collimator lens 12, first aperture array member 13, condenser lens 14, second aperture array member 15, blanker array 16, blanking aperture 17, deflector 18, and objective lens array 19. Also, the drawing unit 10 includes a substrate stage 21, which is movable while holding a substrate 20.

The charged particle source 11 adopts, for example, an electron emission type electron source including electron emission materials such as $LaB_6$ and BaO/W. The collimator lens 12 adopts, for example, an electrostatic type lens which collimates a charged particle beam by an electric field. The collimator lens 12 converts a charged particle beam radiated from the charged particle source 11 into a collimated beam, and the collimated beam is incident on the first aperture array member 13. The first aperture array member 13 has a plurality of apertures which are arrayed in a matrix, thereby dividing a charged particle beam as the collimated beam into a plurality of beams. The charged particle beams divided by the first aperture array member 13 pass through the condenser lens 14, and the second aperture array member 15 is irradiated with these charged particle beams. The second aperture array member 15 includes a plurality of sub-arrays 15a on each of which a plurality of apertures 15b are formed. The respective sub-arrays 15a are arranged in correspondence with the charged particle beams divided by the first aperture array member 13, and further divide the respective charged particle beams to generate a plurality of charged particle beams. Each sub-array 15a of the first embodiment has 16 (4×4) apertures 15b, thereby further dividing each of the charged particle beams divided by the first aperture array member 13 into 16 (4×4) beams. The charged particle beams divided by the sub-arrays 15a of the second aperture array member 15 are incident on the blanker array 16 including a plurality of blankers which independently deflect the charged particle beams. Each blanker is configured by two counter electrodes, and by applying a voltage across the two electrodes, an electric field is generated to deflect a charged particle beam. The charged particle beams deflected by the blanker array 16 are intercepted by the blanking aperture 17 arranged after the blanker array 16 and do not reach the substrate. On the other hand, the charged particle beams which are not deflected by the blanker array 16 pass through apertures formed on the blanking aperture 17, and reach the substrate. That is, the blanker array 16 switches whether or not to irradiate the substrate 20 with the charged particle beams. The charged particle beams which have passed through the blanking aperture 17 are incident on the deflector 18 required to scan the charged particle beams on the substrate. The deflector 18 simultaneously deflects the plurality of charged particle beams in, for example, the x direction (scanning direction) parallel to deflection of the charged particle beams by the blanker array 16. Thus, the plurality of charged particle beams which have passed through the objective lens array 19 can be scanned on the substrate. The substrate stage 21 holds the substrate 20 by, for example, an electrostatic chuck, and is movable in the x and y directions.

The control unit 30 includes, for example, a blanking control circuit 31, deflection control circuit 32, stage control circuit 33, and controller 34. The blanking control circuit 31 individually controls the plurality of blankers included in the blanker array 16 based on drawing data supplied from the controller 34. The deflection control circuit 32 controls the deflector 18 based on a deflection signal supplied from the controller 34. The stage control circuit 33 includes, for example, a laser interferometer (not shown) used to measure the current position of the substrate stage 21, and controls the substrate stage 21 to reduce a deviation between the current position and target position of the substrate stage 21.

Figure 2:
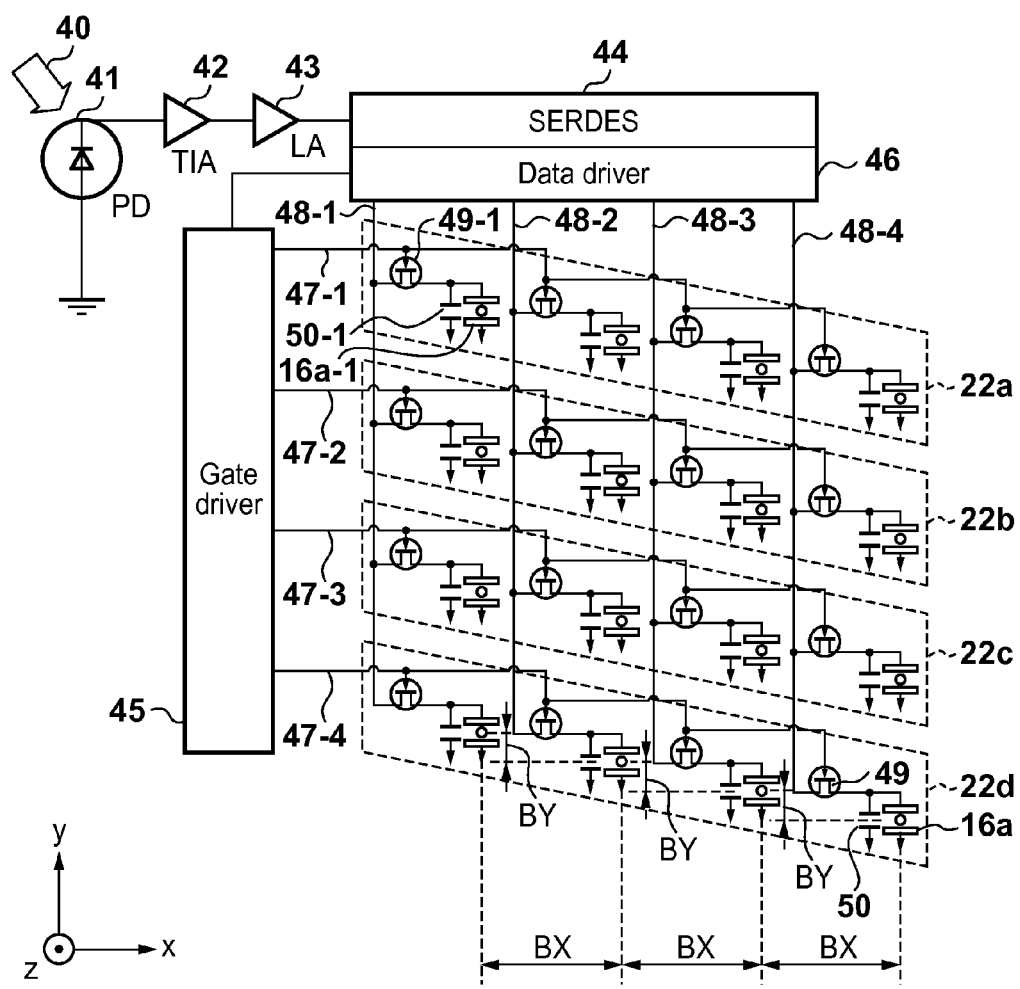
FIG. 2 is a circuit diagram showing a layout of a plurality of blankers according to the first embodiment.

Deflections of the charged particle beams in the blanker array 16 will be described below with reference to FIG. 2. FIG. 2 shows the arrangement of the plurality of blankers 16a which individually deflect a plurality of charged particle beams divided by one sub-array 15a (having, for example, 4×4 apertures 15b). The plurality of blankers 16a include four groups 22a to 22d which are arranged to be spaced apart from each other in a direction (y direction) perpendicular to the scanning direction. Each group includes four blankers 16a which are arranged at a pitch BX in the x direction and a pitch BY in the y direction. To the plurality of blankers 16a, a light signal 40 is supplied from the blanking control circuit 31 via one optical fiber as a signal to be supplied to the blankers 16a. The supplied light signal 40 is received by a photodiode 41 (PD), and is supplied to a transfer impedance amplifier 42 (TIA) as an electrical signal. The signal supplied to the TIA undergoes current-voltage conversion in the TIA, and then undergoes amplitude adjustment in a limiting amplifier 43 (LA). The amplitude-adjusted signal is converted into signals used to apply voltages to the blankers 16a by a shift register 44. The signals converted by the shift register 44 include four signals in FIG. 2, and are supplied, via corresponding source electrode lines 48 of four source electrode lines 48-1 to 48-4, to the blankers 16a connected to these source electrode lines. A gate driver 45 supplies a control signal to the groups 22a to 22d of the blankers 16a at different timings via four gate electrode lines 47-1 to 47-4. Each gate electrode line 47 and source electrode line 48 are respectively connected to a gate electrode and source electrode of a FET 49 arranged at a point where they intersect with each other. To the drain of the FET 49, one blanker 16a and one capacitor 50 are connected in parallel. For example, an FET 49-1, which is driven by the gate electrode line 47-1 and source electrode line 48-1, is arranged. Then, when the gate driver 45 supplies a control signal to the first group 22a via the gate electrode line 47-1 at a first timing, all the FETs 49 (including the FET 49-1) in the first group 22a are enabled. At this time, for example, when a signal is supplied to the source electrode line 48-1, a current flows through the source-drain path of the FET 49-1 connected to the source electrode line 48-1. Then, a voltage applied to the source electrode line 48-1 is applied to a blanker $16a_1$, and a charge according to that voltage is stored (charged) on a capacitor 50-1 during a period of supply of the control signal. Upon completion of charging of the capacitor 50-1, the gate driver 45 ends supply of the control signal to the first group 22a via the gate electrode line 47-1, and supplies a control signal to the second group 22b via the gate electrode line 47-2 at a second timing. At this time, all the FETs 49 in the first group 22a connected to the gate electrode line 47-1 are disabled, and the voltage of the source electrode line 48-1 ceases to be applied to the blanker $16a_1$ connected to the FET 49-1. However, the blanker $16a_1$ can hold a required voltage by a charge stored on the capacitor 50-1 connected in parallel with it during a period until a next control signal is supplied to the first group 22a. After supply of the control signal to the second group 22b ends, a control signal is supplied to the third group 22c at a third timing. Likewise, after the supply of the control signal to the third group 22c ends, a control signal is supplied to the fourth group 22d at a fourth timing. In this manner, in the first embodiment, the control signal is sequentially supplied to the first group 22a, second group 22b, third group 22c, and fourth group 22d at different timings. For this reason, in the blanker array of the first embodiment, operation timings of the blankers 16a in the groups 22a to 22d, that is, deflection (blanking) timings of charged particle beams in the groups 22a to 22d are different from each other.

Figure 3:
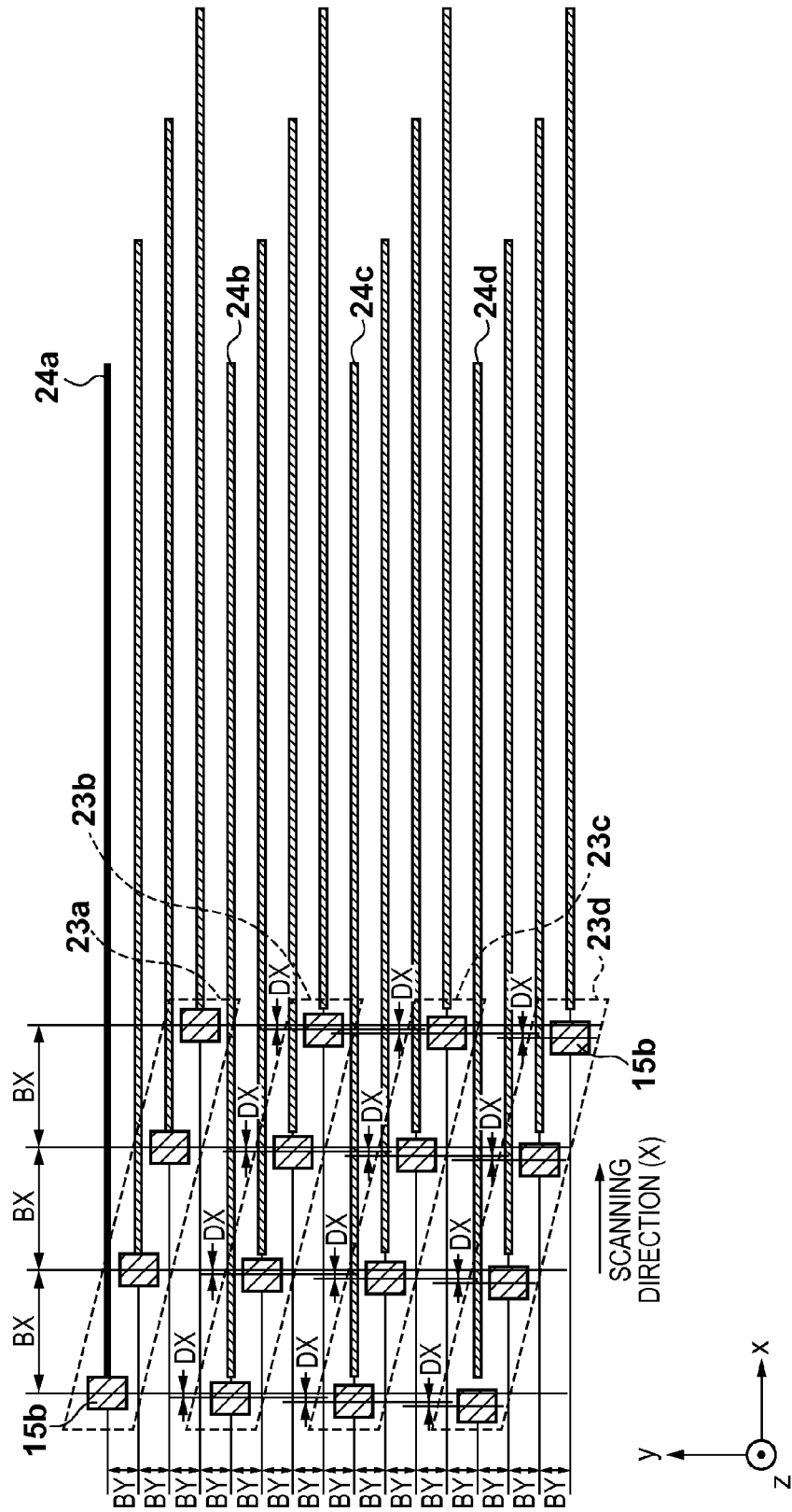
FIG. 3 is a view showing a layout of apertures in a sub-array of the first embodiment, and regions on a substrate, which can be drawn by charged particle beams.

The layout of the plurality of apertures 15b in the sub-array 15a of the first embodiment, and regions 24 on the substrate, which can be drawn by the charged particle beams divided by the sub-array 15a in the drawing apparatus including the blanker array 16 with the above arrangement will be described below with reference to FIG. 3. FIG. 3 shows the layout of the plurality of apertures 15b in the sub-array 15a of the first embodiment, and also shows the regions 24 on the substrate, which can be drawn when the charged particle beams divided by the sub-array 15a are scanned by the deflector 18 in the x direction. The sub-array 15a of the first embodiment includes a plurality of groups 23a to 23d, which are arranged to be spaced apart from each other in a direction (y direction) perpendicular to the scanning direction, in correspondence with the plurality of groups 22a to 22d in the above-mentioned blanker array 16. The plurality of groups 23a to 23d of the sub-array 15a are arranged to be shifted by a distance DX from each other in the scanning direction (x direction). Each of the groups 23a to 23d of the sub-array 15a includes the plurality of apertures 15b, which are arranged at a pitch Bx in the x direction and a pitch By in the y direction. A size of the aperture 15b in the sub-array 15a is defined by Px in the x direction and Py in the y direction. A charged particle beam which has passed through this aperture 15b is reduced-projected on the substrate to, for example, 1/100. The plurality of charged particle beams divided by the sub-array 15a pass through the blankers 16a corresponding to the charged particle beams, and are simultaneously deflected by the deflector 18 in the x direction (scanning direction), so as to be scanned on the substrate. Parallel to this, the control signal is supplied to the plurality of groups 22a to 22d arranged in the y direction in the blanker array 16 at different timings, as described above.

The reason why the groups 23a to 23d are arranged to be shifted from each other in the scanning direction (x direction) in the sub-array 15a of the first embodiment will be described below. Assume that the plurality of groups 23a to 23d in the sub-array 15a are arranged not to be shifted in the scanning direction (x direction), that is, at identical positions in the x direction like in, for example, a conventional sub-array. In this case, charged particle beams divided by the group 23a of the sub-array 15a and those divided by the group 23b are to strike on identical positions on the substrate with respect to the scanning direction. However, the charged particle beams divided by the group 23a are controlled by the first group 22a of the blanker array 16 at the first timing, and those divided by the group 23b are controlled by the second group 22b of the blanker array 16 at the second timing. For this reason, the charged particle beams divided by the group 23a in the sub-array 15a and those divided by the group 23b strike on positions which are deviated from each other in the scanning direction on the substrate. That is, regions 24a to 24d on the substrate, which can be drawn by the charged particle beams passing through the groups 23a to 23d of the sub-array 15a, are deviated from each other in the scanning direction according to supply timing differences of the control signal to the groups 22a to 22d of the blanker array 16. For this reason, in the sub-array 15a of the first embodiment, the plurality of groups 23a to 23d of the sub-array 15a are arranged to compensate for relative positional differences of each other's drawing regions in the scanning direction (x direction), which differences are generated due to the timing differences. Also, the layout of the plurality of groups 22a to 22d in the blanker array 16 of the first embodiment aligns with that of the plurality of groups 23a to 23d of the sub-array 15a. Thus, in the first embodiment, the regions 24 on the substrate, which can be drawn by the charged particle beams divided by the respective groups of the sub-array 15a can be corrected to be target positions in the scanning direction. For example, the groups 23a and 23b, which neighbor in the y direction in the sub-array 15a, are arranged to be shifted by the distance Dx from each other in the scanning direction (x direction). The charged particle beams divided by the group 23a are controlled by the first group 22a of the blanker array 16 corresponding to the group 23a at the first timing. Likewise, the charged particle beams divided by the group 23b are controlled by the second group 22b of the blanker array 16 corresponding to the group 23b at the second timing. At this time, the first and second groups 22a and 22b of the blanker array 16 have a difference between control signal supply timings, but the regions 24 on the substrate, which can be drawn, can be formed at nearly the same positions with respect to the scanning direction (x direction).

Figure 4:
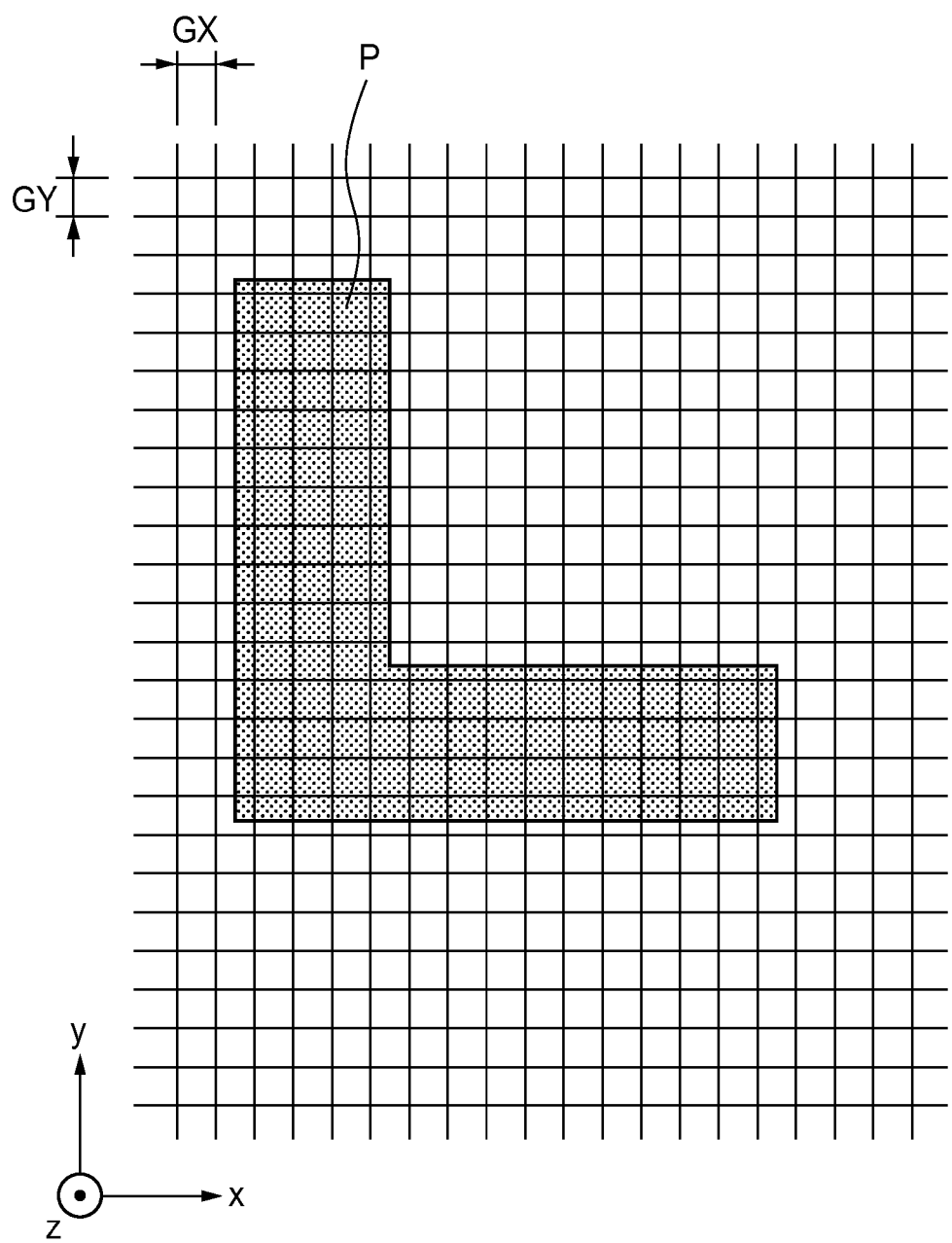
FIG. 4 is a view showing a pattern to be drawn on a substrate.

The distance Dx will be described below together with scan grids. The scan grids will be described first with reference to FIG. 4. FIG. 4 shows a pattern to be drawn on the substrate 20. The scan grid is a grid defined by a dimension (pixel pitch) GX in the x direction and a dimension (pixel pitch) GY in the y direction, as shown in FIG. 4, and each charged particle beam is scanned on the substrate along a line extending in the x direction. An element which forms a grid defined by the dimensions GX and GY corresponds to a minimum dot (pixel), which can be drawn by one charged particle beam. For example, when a pattern P is drawn, the charged particle beams are scanned by the deflector 18 in the x direction, and are controlled by the respective blankers 16a to strike on a portion of the pattern P and not to strike on a portion other than the pattern P.

The distance Dx will be described below. The control signal required to control whether or not to irradiate the substrate with a charged particle beam is time-divisionally supplied to the groups 22a to 22d of the blanker array 16 at time intervals T while the charged particle beams are scanned across the dimension GX in the x direction of the scan grid by the deflector 18. Then, the time interval T corresponds to a supply timing difference of the control signal to each group of the blanker array 16, and is set to assume a value which can supply the control signal to each group of the blanker array 16 within a time period $T_{GX}$ in which the dimension GX in the x direction is scanned by the deflector 18. For example, in FIG. 2, a difference between the first timing at which the control signal is supplied to the first group 22a of the blanker array 16 and the second timing at which the control signal is supplied to the second group 22b is the time interval T. Then, letting V (=$GX/T_{GX}$) be a scanning velocity of the charged particle beam on the substrate by the deflector 18, the charged particle beam is scanned by V×T in the scanning direction from the first timing until the second timing. That is, this V×T corresponds to the distance DX, which is given by:

$$DX = -V \times T + M \times GX \quad (1)$$

where M is set to be an integer. In equation (1), M×GX means that each group of the sub-array 15a is allowed to be further shifted in the scanning direction by a multiple (integer multiple) of the dimension GX of the scan grid in the x direction. In the sub-array 15a of the first embodiment, M=0. When the control signal is time-divisionally supplied to the respective groups of the blanker array 16 a times, the time interval T is preferably set to be the time period $T_{GX}/a$.

When the time interval T is set to be the time period $T_{GX}/a$, the control signal is time-divisionally supplied to the groups of the blanker array 16 a times while each charged particle beam scans the dimension GX. For example, in FIG. 2, from the first timing at which the control signal is supplied to the first group 22a of the blanker array 16 until the second timing at which the control signal is supplied to the second group 22b, the charged particle beam is scanned by GX/a in the scanning direction (x direction). That is, a value (GX/a) obtained by dividing the dimension GX in the scanning direction by the number a of groups of the plurality of groups is used as the distance DX, which is also expressed by:

$$DX = (M - 1/a) \times GX \quad (2)$$

where M is set to be an integer. In equation (2), M×GX means that each group of the sub-array 15a is allowed to be further shifted in the scanning direction by a multiple (integer multiple) of the dimension GX of the scan grid in the x direction as in equation (1). In the sub-array 15a of the first embodiment, M=0.

As described above, the plurality of groups 23a to 23d of the sub-array 15a of the first embodiment are arranged to be shifted from each other by the distance DX in the scanning direction according to the supply timing difference of the control signal to the plurality of groups 22a to 23d of the blanker array 16. Then, by arranging the respective groups of the sub-array 15a in this way, the regions 24 on the substrate, which can be drawn by the charged particle beams divided by the respective groups of the sub-array 15a, can be corrected to be target positions in the scanning direction.

Figure 5:
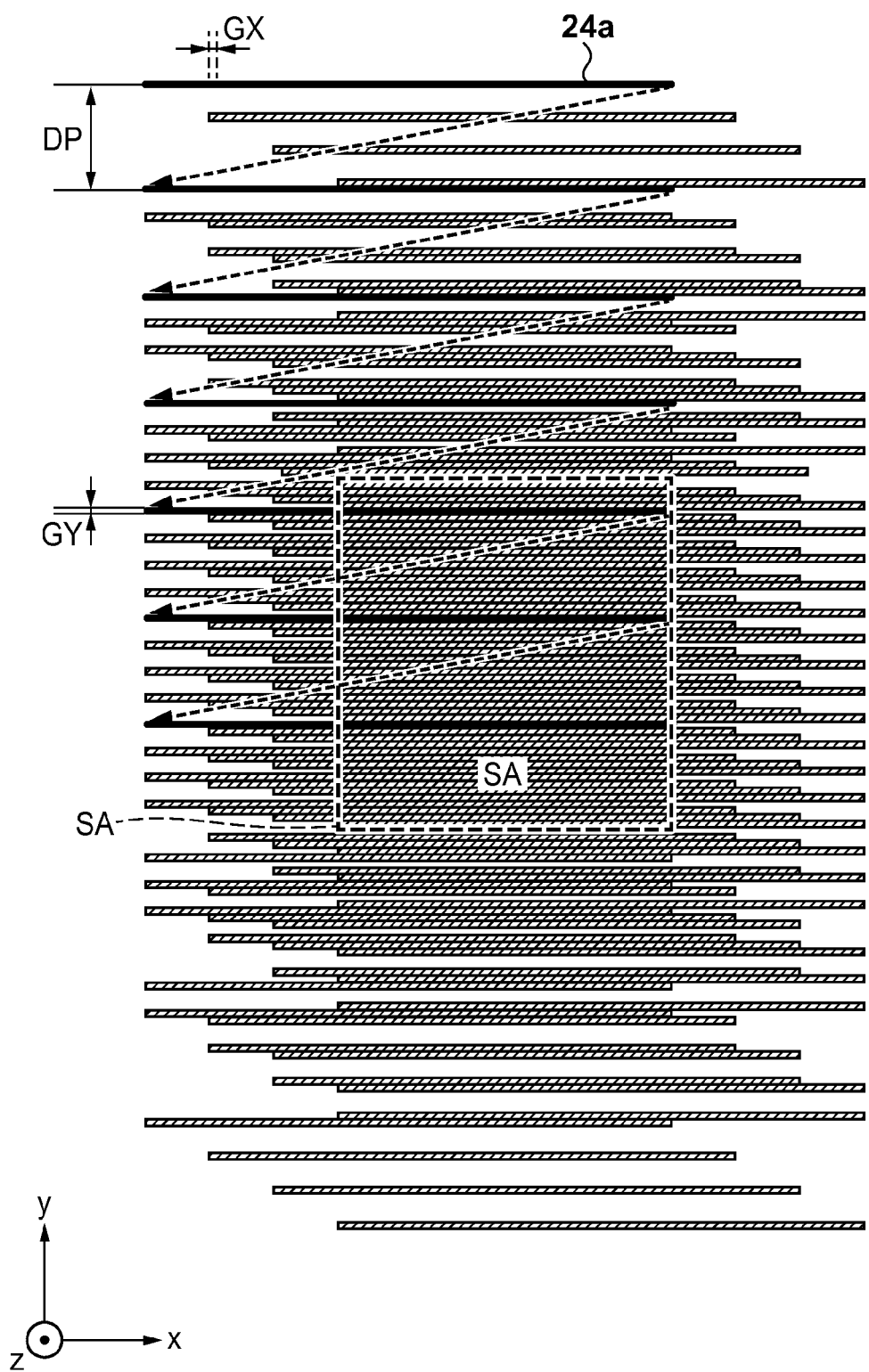
FIG. 5 is a view showing a region on a substrate, which can be drawn by a plurality of charged particle beams divided by one sub-array.

Regions on the substrate, which can be drawn by the plurality of charged particle beams divided by one sub-array 15a upon scanning of the charged particle beams by the deflector 18 and movement of the substrate 20 by the substrate stage 21, will be described below with reference to FIG. 5. FIG. 5 shows stripe regions drawn by the plurality of charged particle beams divided by one sub-array 15a. Referring to FIG. 5, a region 24a filled by black indicates that which can be drawn by a charged particle beam which has passed through an aperture $15b_1$ in FIG. 3. After the charged particle beam which has passed through the aperture $15b_1$ draws the uppermost region 24a, it sequentially draws regions 24a via flyback in a −x direction and movement of the substrate stage 21 in a −y direction, as indicated by dotted arrows. At this time, charged particle beams which have passed through the apertures 15b other than the aperture $15b_1$ draw corresponding regions on the substrate 20 in the same manner as the former charged particle beam. For this reason, a stripe region SA having a stripe width SW is filled up by the regions 24 drawn by the respective charged particle beams, as indicated by the dotted line in FIG. 5. That is, the stripe region SA can be drawn by continuous movement of the substrate stage 21, and if the number of charged particle beams divided by the sub-array 15a is N×N, conditions of the stripe region SA are expressed by:

$$N^2 = K \times L + 1 \quad (3)$$

where K and L are natural numbers.

$$BY = GY \times K \quad (4)$$

$$DP = (K \times L + 1) \times GY = N^2 \times GY \quad (5)$$

By setting K and L which satisfy equation (3), an interval BY in the y direction in the sub-array 15a can be determined using equation (4), and a moving amount DP of the substrate stage 21 can be determined using equation (5). For example, when N=4, K=5, L=3, and GY=5 nm are set in the drawing apparatus 100 of the first embodiment, the interval BY is 25 nm, and the moving amount DP of the substrate stage 21 is 80 nm. In the drawing apparatus 100 of the first embodiment, the stripe width SW is set to be 2 μm. Note that in order to improve the throughput of the drawing apparatus, a region which is not used in drawing, that is, that other than the stripe region SA is required to be reduced. In order to reduce a region other than the stripe region SA, a small interval BX in the sub-array 15a is set to satisfy N×By>Bx.

FIG. 6 is a view for explaining the positional relationship of a plurality of stripe regions SA. As described above, one strike drawing region SA is that on the substrate, which can be drawn by the plurality of charged particle beams divided by one sub-array 15a. Then, the plurality of charged particle beams divided by one sub-array 15a pass through one objective lens OL in the objective lens array 19. On the objective lens array 19, for example, a plurality of objective lenses OL, which are arrayed in the x direction at a pitch of 144 μm, are arranged while being shifted from each other by 2 μm as the stripe width SW in the x direction, as shown in FIG. 6. With this configuration of the objective lens array 19, the plurality of stripe regions SA can be arranged without any gaps. The objective lens array 19 is configured by 4×9 objective lenses OL in FIG. 6. However, in practice, the objective lens array 19 can be configured by many objective lenses OL (for example, 72×180 lenses). By configuring the objective lens array in this way, regions EA on the substrate can be drawn by continuously moving the substrate stage 21 along the y direction.

Second Embodiment

Figure 7:
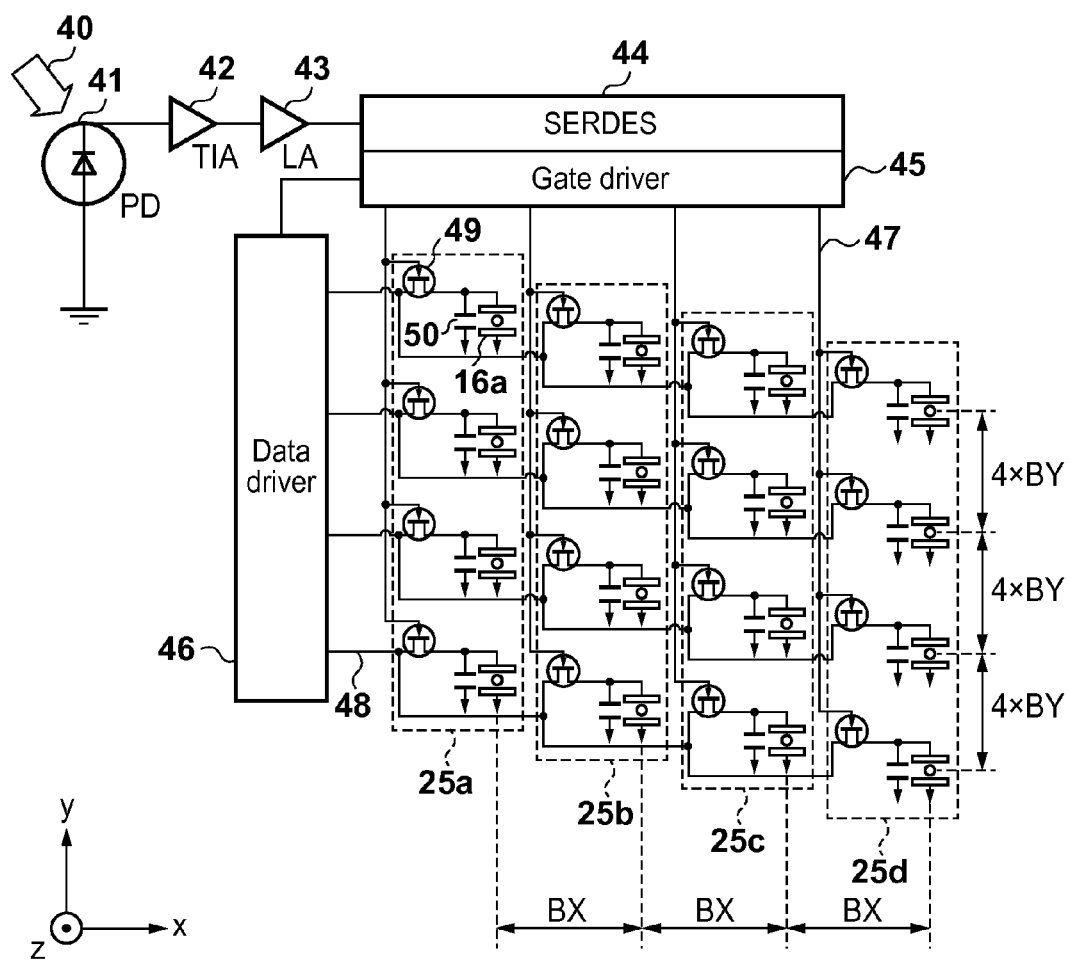
FIG. 7 is a circuit diagram showing a layout of a plurality of blankers according to the second embodiment.

A drawing apparatus of the second embodiment will be described below. In the drawing apparatus of the second embodiment, the arrangement of a plurality of blankers 16a in a blanker array 16 is different from that of the drawing apparatus 100 of the first embodiment. FIG. 7 shows the arrangement of the plurality of blankers 16a which respectively deflect charged particle beams divided by one sub-array 15a (having, for example, 4×4 apertures 15b) in the drawing apparatus of the second embodiment. The plurality of blankers 16a include, for example, four groups 25a to 25d, which are arranged to be spaced apart from each other by an interval BX in a scanning direction (x direction), and each group includes four blankers 16a which are arranged at an interval of 4×BY. Compared to the arrangement of the plurality of blankers 16a in the first embodiment, a gate driver 45 and data driver 46 are replaced. Then, in the drawing apparatus of the second embodiment, a control signal is supplied to the plurality of groups 25a to 25d arrayed in the scanning direction (x direction) at different timings.

Figure 8:
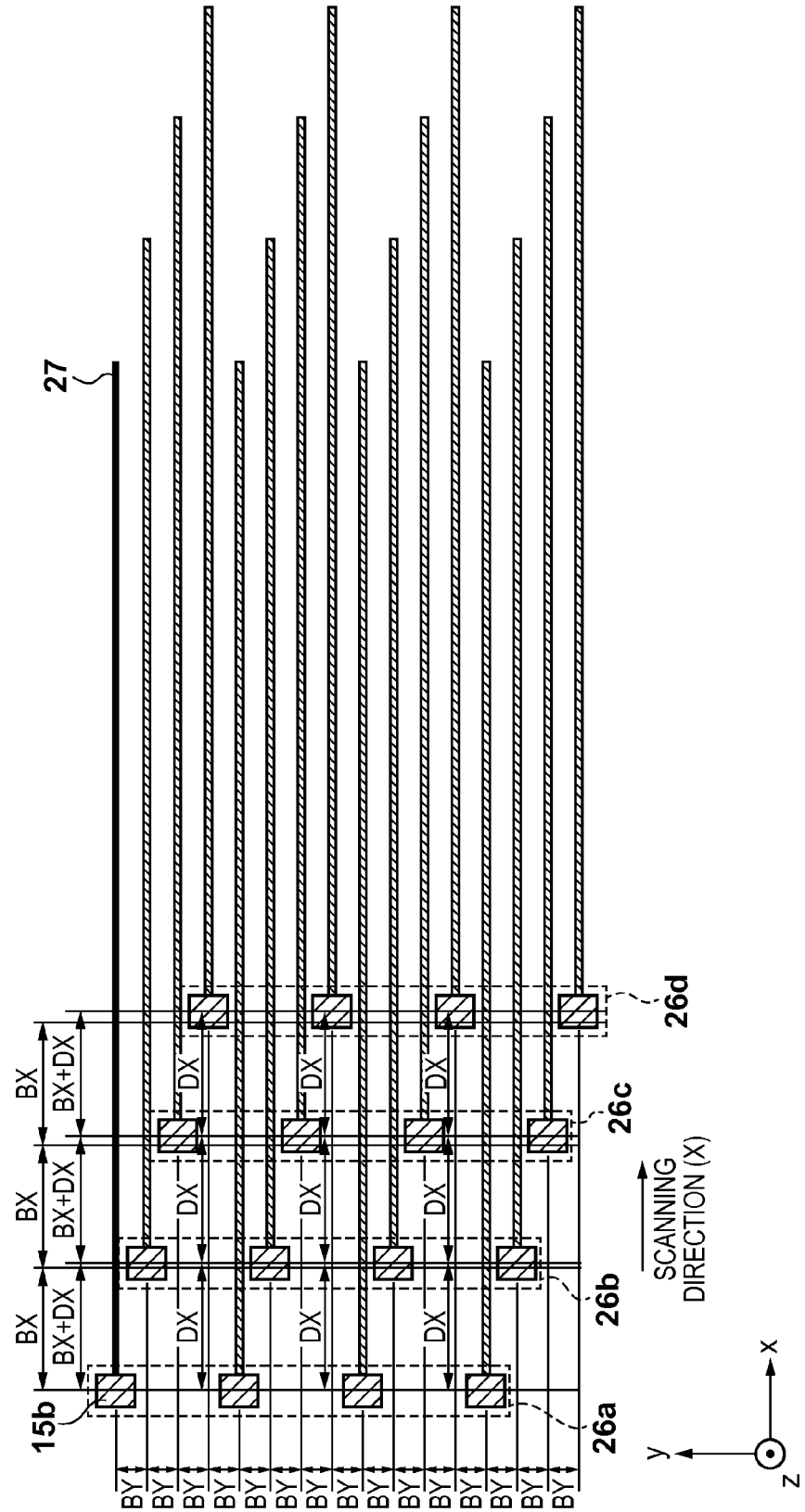
FIG. 8 is a view showing a layout of apertures in a sub-array of the second embodiment, and regions on a substrate, which can be drawn by charged particle beams.

The layout of the plurality of apertures 15b in the sub-array 15a of the second embodiment, and regions on a substrate, which can be drawn by charged particle beams divided by the sub-array 15a will be described below with reference to FIG. 8. FIG. 8 shows the layout of the plurality of apertures 15b in the sub-array 15a of the second embodiment, and also regions 27 on the substrate, which can be drawn when the charged particle beams divided by the sub-array 15a are scanned by a deflector 18 in the x direction. The sub-array 15a of the second embodiment includes a plurality of groups 26a to 26d in correspondence with the plurality of groups 25a to 25d in the blanker array 16. Each group includes a plurality of apertures 15b which are arranged at an interval of 4×BY in the y direction. Then, in the sub-array 15a of the second embodiment, the plurality of groups 26a to 26d are arranged at an interval of BX+DX. A distance DX in the second embodiment is calculated using equation (1) or (2) above, and M is set to be a positive integer (natural number). For this reason, the distance DX in the second embodiment assumes a positive value, and the respective groups of the sub-array 15a are arranged at an interval broader by DX than an interval BX in the x direction in the conventional sub-array. By arranging the respective groups of the sub-array, the regions 27 on the substrate, which can be drawn by charged particle beams divided by the respective groups, can be corrected from being deviated in the scanning direction. For example, the groups 26a and 26b, which neighbor in the x direction in the sub-array 15a, are arranged at the interval of BX+DX in the scanning direction (x direction). Then, charged particle beams divided by the group 26a are controlled by the corresponding first group 25a in the blanker array 16, and those divided by the group 26b are controlled by the corresponding second group 25b in the blanker array 16. At this time, the first and second groups 25a and 25b in the blanker array 16 have a difference between control signal supply timings, but regions on the substrate, which can be drawn, can be set to be target positions in the scanning direction.

As described above, in the sub-array 15a of the second embodiment, the plurality of groups 26a to 26d, which are arrayed along the x direction (scanning direction), are arranged at the interval of BX+DX in the scanning direction. Then, by arranging the plurality of groups 26a to 26d in the sub-array 15a, regions on the substrate, which can be drawn by charged particle beams divided by the respective groups, can be corrected to be target positions in the scanning direction.

<Embodiment of Method of Manufacturing Article>

A method of manufacturing an article according to an embodiment of the present invention is suitable to manufacture an article such as a micro device such as a semiconductor device or an element having a microstructure. The method of manufacturing an article of this embodiment includes a step of forming a latent image pattern on a photosensitive agent applied on a substrate (a step of performing drawing on the substrate), and a step of developing the substrate on which the latent image pattern is formed in the above step. Furthermore, the manufacturing method includes other known steps (oxidization, film formation, deposition, doping, planarization, etching, resist removal, dicing, bonding, packaging, etc.) The method of manufacturing an article of this embodiment is advantageous in at least one of performance, quality, productivity, and manufacturing cost of an article compared to the conventional method.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-228446 filed on Oct. 15, 2012, which is hereby incorporated by reference herein in its entirety.

What is claimed is:

1. A drawing apparatus for performing drawing on a substrate with a plurality of charged particle beams, comprising:
    a blanker array including a first blanker and a second blanker, the first and second blankers being configured to respectively control blanking of a first charged particle beam and a second charged particle beam out of the plurality of charged particle beams;
    a deflector configured to deflect charged particle beams which have passed through the blanker array out of the plurality of charged particle beams to scan the charged particle beams on the substrate in a scanning direction; and
    a controller configured to supply a control signal to the first blanker at a first timing and supply a control signal to the second blanker at a second timing different from the first timing,
    wherein a period between the first and second timings is shorter than a period in which one charged particle beam is scanned by the deflector across a dimension in the scanning direction of one pixel, and
    the second blanker is arranged at a position shifted from a position of the first blanker in the scanning direction by an amount corresponding to a distance by which the charged particle beams are scanned by the deflector in the period between the first and second timings.

2. The apparatus according to claim 1, further comprising an aperture array member in which a plurality of apertures are formed to generate the plurality of charged particle beams,
    wherein a layout of the plurality of apertures formed in the aperture array member is aligned with a layout of the first and second blankers.

3. The apparatus according to claim 1, wherein the first and second blankers are respectively arranged at positions which are shifted from each other by a value based on a scanning velocity, with which the charged particle beam is scanned by the deflector, and the period between the first and second timings.

4. The apparatus according to claim 1, wherein the blanker array includes a plurality of groups including a first group which has the first blanker and a second group which has the second blanker, and
    the first group and the second group are arranged at respective positions which are shifted from each other by a multiple of a value obtained by dividing a pixel pitch in the scanning direction by number of groups in the plurality of groups.

5. The apparatus according to claim 1, wherein the first and second blankers are arranged apart from each other in a direction perpendicular to the scanning direction.

6. The apparatus according to claim 1, wherein the first and second blankers are arranged apart from each other in the scanning direction.

7. The apparatus according to claim 1, further comprising a capacitor connected in parallel with each blanker,
    wherein the capacitor is configured to store a charge in accordance with the control signal during a period of supply of the control signal, so as to hold a voltage to be applied to a blanker corresponding thereto during a period of non-supply of the control signal.

8. The apparatus according to claim 1, wherein the first and second blankers are arranged such that a position on which the first charged particle beam is incident at the first timing and a position on which the second charged particle beam is incident at the second timing are the same positions on the substrate with respect to the scanning direction.

9. The apparatus according to claim 1, wherein
    the blanker array includes a third blanker configured to control blanking of a third charged particle beam, which is different from the first and second charged particle beams, out of the plurality of charged particle beams,
    the controller supplies the control signal to the second blanker at the second timing after the first timing and supplies a control signal to the third blanker at a third timing after the first and second timings,
    wherein in the scanning direction, a distance between the first and third blankers is larger than a distance between the first and second blankers.

10. The apparatus according to claim 1, wherein the first and second blankers are arranged such that a position on which the first charged particle beam is incident at the first timing and a position on which the second charged particle beam is incident at the second timing are different from each other with respect to the scanning direction.

11. The apparatus according to claim 1, wherein
    a first period for supplying the control signal to the first blanker and a second period for supplying the control signal to the second blanker are not overlapped with each other, and
    a sum of the first period and the second period is shorter than the period in which one charged particle beam is scanned by the deflector across the dimension in the scanning direction of one pixel.

12. The apparatus according to claim 11, further comprising a first capacitor connected in parallel with the first blanker and a second capacitor connected in parallel with the second blanker,
    wherein the first period is a period in which a voltage is applied to the first capacitor, and the second period is a period in which a voltage is applied to the second capacitor.

13. The apparatus according to claim 12, wherein the respective voltages are applied to the first and second capacitors via a common line.

\* \* \* \* \*